United States Patent
Kim et al.

(10) Patent No.: US 9,173,071 B2
(45) Date of Patent: *Oct. 27, 2015

(54) RATE ADAPTIVE TRANSMISSION OF WIRELESS BROADCAST PACKETS

(75) Inventors: Donnie H. Kim, Santa Clara, CA (US); Kang-Won Lee, Nanuet, NY (US); Ramya Raghavendra, White Plains, NY (US); Yang Song, Ossining, NY (US); Ho Yin Starsky Wong, Ossining, NY (US)

(73) Assignee: Global Foundries U.S. 2 LLC, Hopewell Junction, NY (US)

(*) Notice: Subject to any disclaimer, the term of this patent is extended or adjusted under 35 U.S.C. 154(b) by 567 days.

This patent is subject to a terminal disclaimer.

(21) Appl. No.: 13/593,590

(22) Filed: Aug. 24, 2012

(65) Prior Publication Data
US 2014/0040693 A1 Feb. 6, 2014

Related U.S. Application Data

(63) Continuation of application No. 13/562,506, filed on Jul. 31, 2012.

(51) Int. Cl.
| | |
|---|---|
| *H04W 4/06* | (2009.01) |
| *H03M 13/37* | (2006.01) |
| *H03M 13/35* | (2006.01) |
| *H03M 13/00* | (2006.01) |
| *H03M 13/15* | (2006.01) |

(52) U.S. Cl.
CPC .............. *H04W 4/06* (2013.01); *H03M 13/353* (2013.01); *H03M 13/3761* (2013.01); *H03M 13/635* (2013.01); *H03M 13/6527* (2013.01); *H03M 13/1515* (2013.01)

(58) Field of Classification Search
CPC .............. H04W 4/06; H03M 13/1515; H03M 13/6527; H03M 13/635; H03M 13/353; H03M 13/3761
USPC .......... 714/746, 755, 786, 784, 774; 370/252, 370/312, 329, 335, 432
See application file for complete search history.

(56) References Cited

U.S. PATENT DOCUMENTS

| | | | |
|---|---|---|---|
| 6,480,497 B1 | 11/2002 | Flammer, III et al. | |
| 6,940,856 B2 | 9/2005 | Vu | |
| 7,392,014 B2 * | 6/2008 | Baker et al. | ................ 455/67.11 |

(Continued)

OTHER PUBLICATIONS

U.S. Appl. No. 13/562,506, printed Aug. 23, 2012, 1 page.

(Continued)

*Primary Examiner* — Guy Lamarre
(74) *Attorney, Agent, or Firm* — Stephen J. Walder, Jr.; Francis Lammes

(57) ABSTRACT

Mechanisms are provided for broadcasting data to a plurality of receiver devices. A data broadcast transmission rate and a level of error correction to be used when broadcasting data are determined based on prior feedback received from the plurality of receiver devices. The feedback comprises channel condition information specifying conditions of one or more connections of a channel over which data was previously broadcast to the receiver devices. Data to be broadcast to the plurality of receivers is encoded in accordance with the determined level of error correction. The encoded data is broadcast at the determined data broadcast transmission rate over the channel to the plurality of receiver devices.

19 Claims, 7 Drawing Sheets

(56) References Cited

U.S. PATENT DOCUMENTS

| | | | |
|---|---|---|---|
| 7,808,908 | B1 | 10/2010 | Bharghavan et al. |
| 8,826,102 | B2 | 9/2014 | Liu et al. |
| 2004/0228282 | A1 | 11/2004 | Bao et al. |
| 2005/0094659 | A1* | 5/2005 | Watson .................. 370/432 |
| 2006/0146822 | A1 | 7/2006 | Kolakowski et al. |
| 2008/0002621 | A1 | 1/2008 | Ginzburg et al. |
| 2008/0064425 | A1 | 3/2008 | Kim et al. |
| 2008/0168332 | A1 | 7/2008 | Palanki et al. |
| 2009/0067336 | A1 | 3/2009 | Cho et al. |
| 2009/0080510 | A1* | 3/2009 | Wiegand et al. ......... 375/240.01 |
| 2009/0135950 | A1 | 5/2009 | Hoffmann et al. |
| 2010/0002692 | A1 | 1/2010 | Bims |
| 2010/0050055 | A1 | 2/2010 | Tanaka et al. |
| 2010/0074135 | A1 | 3/2010 | Pepper |
| 2010/0185915 | A1* | 7/2010 | Xu et al. .................. 714/752 |
| 2010/0188271 | A1* | 7/2010 | Le Scouarnec et al. ........ 341/51 |
| 2010/0223533 | A1 | 9/2010 | Stockhammer et al. |
| 2010/0226262 | A1 | 9/2010 | Liu et al. |
| 2010/0235710 | A1 | 9/2010 | Kawamoto et al. |
| 2010/0246429 | A1* | 9/2010 | Hwang et al. .................. 370/252 |
| 2010/0260180 | A1 | 10/2010 | Wu et al. |
| 2011/0059691 | A1 | 3/2011 | Hegge |
| 2011/0243052 | A1* | 10/2011 | Alay et al. .................. 370/312 |
| 2011/0264977 | A1 | 10/2011 | Chen et al. |
| 2011/0274202 | A1* | 11/2011 | Jeong et al. .................. 375/295 |
| 2012/0011413 | A1 | 1/2012 | Liu et al. |
| 2013/0215996 | A1* | 8/2013 | Boutros et al. ............... 375/295 |
| 2013/0263201 | A1 | 10/2013 | Chung-How et al. |
| 2013/0294321 | A1 | 11/2013 | Wang et al. |
| 2014/0040495 | A1 | 2/2014 | Vishwanath Kamath et al. |
| 2014/0307734 | A1 | 10/2014 | Luby et al. |

OTHER PUBLICATIONS

Alay, Ozgu et al., "Cooperative Layered Video Multicast Using Randomized Distributed Space Time Codes", IEEE Transactions on Multimedia, vol. 13, No. 5, Oct. 2011, pp. 1127-1140.

Lee, T.W. A. et al., "Joint Allocation of Bandwidth abd FEC Across Layers for Video Multicast over Wired and Wireless Networks", IEEE Globecom 2001, 23 pages.

Lee, Kyungsoo et al., "On the Utility of Rate Adaptation for Broadcast/Multicast Media Traffic in 802.11 Networks", ACM CoNEXT'09 Student Workshop, Rome, Italy, Dec. 1, 2009, 2 pages.

Liu, Leo X. et al., "Rate-distortion Optimized Joint Source/Channel Coding of WWAN Multicast Video for a Cooperative Peer-to-Peer Collective", IEEE Transactions on Circuits and Systems for Video Technology, Mar. 2010, 16 pages.

Pefkianakis, Ioannis et al., "MIMO Rate Adaptation in 802.11n Wireless Networks", ACM MobiCom '10, Chicago, IL Sep. 20-24, 2010, 12 pages.

Piamrat, Kandaraj et al., "Q-DRAM: QoE-based Dynamic Rate Adaptation Mechanism for Multicast in Wireless Networks", IEEE Globecom, 2009, 6 pages.

Samokhina, Maria et al , "Raptor Code-Based Video Multicast over IEEE 802.11 WLAN", Proceedings of IEEE TVS Asia Pacific Communications Symposium APWCS08, 2008, 5 pages.

Vutukuru, Mythili et al., "Cross-Layer Wireless Bit Rate Adaptation", ACM SIGCOMM'09, Aug. 17-21, 2009, Barcelona, Spain, 12 pages.

Wong, Starsky H. et al., "Robust Rate Adaptation for 802.11 Wireless Networks", ACM MobiCom '06, Sep. 23-26, 2006, Los Angeles, CA, 12 pages.

Xu, Xiaofeng et al., "Fine-Granular-Scalability Video Straeming Over Wireless Lans Using Cross Layer Error Control", IEEE, ICASSP, 2004, 4 pages.

U.S. Appl. No. 13/871,562, printed Jun. 4, 2013, 1 page.

"SRM (Scalable Reliable Multicast)", http://www.icir.org/floyd/srm.html, retrieved Mar. 4, 2013, 2 pages.

Adamson, B. et al., "NACK-Oriented Reliable Multicast (NORM) Transport Protocol", IETF Trust, Network Working Group Request for Comments; 5740, Nov. 2009, pp. 1-95.

Bhandari, Vartika et al., "Reliable Local Broadcast in a Wireless Network Prone to Byzantine Failures", Proceedings of the DIALM-POMC International Workshop on Foundations of Mobile Computing, Portland, Oregon, Aug. 16, 2007, 8 pages.

Gossain, Hrishikesh et al., "Multicast; Wired to Wireless", Multicasting in a Wireless Environment, IEEE Communications Magazine, Jun. 2002, pp. 116-123.

Kondo, Yoshihisa et al., "Reliable Wireless Broadcast with Random Network Coding for Real-time Applications", WCNC 2009 proceedings, http://www-mobile.ecs.soton.ac.uk/home/conference/wcnc2009/DATA/T03S32P02.PDF, IEEE 2009, retrieved Apr. 26, 2013, 6 pages.

Kumar, Rajnish et al., "On Improving Wireless Broadcast Reliability of Sensor Networks Using Erasure Codes", http://www.cc.gatech.edu/projects/up/publications/kumar-fbcast_msn06.pdf, retrieved Apr. 26, 2013, 15 pages.

McKinley, Philip K. et al., "A Study of Adaptive Forward Error Correction for Wireless Collaborative Computing", IEEE Transactions on Parallel and Distributed Systems, vol. 13, No. 9, Sep. 2002, pp. 936-947.

Mohsin, Mansoor et al., "Reliable Broadcast in Wireless Mobile Ad Hoc Networks", Proceedings of the 39th Hawaii International Conference on System Sciences, 2006, 10 pages.

Nafaa, Abdelhamid et al., "Forward Error Correction Strategies for Media Streaming over Wireless Networks", Mobile Internet Technologies and Applications, IEEE Communications Magazine, Dec. 2007-Jan. 2008, pp. 72-79.

Nguyen, Dong et al., "Wireless Broadcasting Using Network Coding", http://code.ucsd.edu/netcod07/abstracts/NetCod07-NgNgBo.pdf, retrieved Apr. 26, 2013, 6 pages.

Paul, Sanjoy et al., "Reliable Multicast Transport Protocol (RMTP)", IEEE Journal on Selected Areas in Communications, vol. 15, No. 3, Apr. 1997, pp. 407-421.

Rizzo, Luigi et al., "RMDP: an FEC-based Reliable Multicast protocol for wireless environments", ACM SIGMOBILE Mobile Computing and Communications Review, vol. 2, No. 2, Apr. 1998, pp. 23-31.

Rubenstein, Dan , "Real-Time Reliable Multicast Using Proactive Forward Error Correction", University of Massachusetts—Amherst, Computer Science Department Faculty Publication Series, Paper 70, 1998, 16 pages.

Stann, Fred et al., "RBP: Reliable Broadcast Propagation in Wireless Networks", USC/Information Sciences Institute, Technical Report ISI-TR-2005-608, http://www.isi.edu/~johnh/Papers/Stann05b.pdf, Nov. 2005, 15 pages.

Stann, Fred et al., "RBP: Reliable Broadcast Propagation in Wireless Networks", USC/ISI Technical Report ISI-TR-2005-608, Submitted to Mobisys 2006, Uppsala, Sweden, Jun. 19-22, 2006, 14 pages.

Stann, Fred et al., "RBP: Robust Broadcast Propagation in Wireless Networks", SenSys'06, Boulder, Colorado, Nov. 1-3, 2006, pp. 85-98.

Varshney, Upkar , "Multicast Over Wireless Networks", Communications of the ACM, vol. 45, No. 12, Dec. 2002, pp. 31-37.

Vinh, Phan V. et al., "RSBP: A Reliable Slotted Broadcast Protocol in Wireless Sensor Networks", Open Access, Sensors 2012, Received: Sep. 15, 2012; in revised form: Oct. 27, 2012; Accepted: Oct. 29, 2012; published Oct. 31, 2012, 17 pages.

Xiao, Weiyao et al., "Reliable Wireless Broadcasting with Near-Zero Feedback", http://people.bu.edu/staro/Infocom_QE_Final.pdf, retrieved Apr. 26, 2013, 9 pages.

Wong, Starsky H. et al., "A Joint Rate and FEC Adaptation to Enable Approach to Enable High Speed Broadcast in IEEE 802.11 Networks", The Sixth Annual Conference of the International Technology Alliance (ACITA 2012), Southampton, UK, Sep. 2012, 8 pages.

* cited by examiner

```
R2D2 Algorithm

If R(t) > R(t-1) then
2:     Compare SameRate, IncreaseRate, and Rollback
       if SameRate is largest: then
4:         Call function f₀().
       end if
6:     if IncreaseRate is largest: then
           Call function f₁().
8:     end if
       if Rollback is largest: then
10:        Call function f₃().
       end if
12: end if
   if R(t) < R(t-1) then
14:    Compare SameRate, DecreaseRate, and Rollback
       if SameRate is largest: then
16:        Call function f₀().
       end if
18:    if DecreaseRate is largest: then
           Call function f₂().
20:    end if
       if Rollback is largest: then
22:        Call function f₃().
       end if
24: end if
   if R(t) = R(t-1)
26:    Compare SameRate, IncreaseRate, and DecreaseRate
       if SameRate is largest: then
28:        Call function f₀().
       end if
30:    if IncreaseRate is largest: then
           Call function f₁().
32:    end if
       if DecreaseRate is largest: then
34:        Call function f₂().
       end if
36: end if
   where ties are broken arbitrarily.

Subroutines:
f₀(): Keep the same rate and set $D(t+1)$ to $D^*\overline{p_2}(t)$.
f₁(): Increase the rate by one level (if exists), and set $D(t+1)$ to
      $D^*(\overline{p_2}(t)^+)$.
f₂(): Decrease the rate by one level (if exists), and set $D(t+1)$ to
      $D^*(\overline{p_2}(t)^-)$.
f₃(): Rollback $D(t+1)$ and $R(t+1)$ to the previous setting, i.e. $R(t+1) = R(t-1)$, $D(t+1) = D^*(\overline{p_2}(t-1))$.
```

RATE ADAPTIVE TRANSMISSION OF WIRELESS BROADCAST PACKETS

GOVERNMENT RIGHTS

This invention was made with United States Government support under Contract No. W911NF-06-3-0001 awarded by the U.S. Army. THE GOVERNMENT HAS CERTAIN RIGHTS IN THIS INVENTION.

BACKGROUND

The present application relates generally to an improved data processing and data communication apparatus and method and more specifically to mechanisms for enabling rate adaptive transmission of wireless broadcast packets.

Rate adaptation is a media access controller (MAC) layer mechanism in IEEE 802.11 wireless networks to ensure efficient utilization of wireless channels having constantly varying channel conditions. Rate adaptation modules in wireless communication devices, e.g., laptops, smart phones, tablet computing devices, wireless access points, and the like, are decision logic elements that decide which modulation scheme (defined in the wireless standards) is to be used to transmit data packets in order to maximize the transmission throughput. For example, in IEEE 802.11n standard, a sending device can send data packets to a receiving device from 6.5 to 600 Mbps when unicast mode is chosen, depending on the distance and channel condition between the sending and receiving devices. The sending device is the device that chooses the rate of transmission based on the distance and channel condition.

SUMMARY

In one illustrative embodiment, a method, in a data processing system, is provided for broadcasting data to a plurality of receiver devices. The method comprises determining, by the data processing system, a data broadcast transmission rate and a level of error correction to be used when broadcasting data based on prior feedback received from the plurality of receiver devices. The feedback comprises channel condition information specifying conditions of one or more connections of a channel over which data was previously broadcast to the receiver devices. The method further comprises encoding, by the data processing system, data to be broadcast to the plurality of receivers in accordance with the determined level of error correction. Moreover, the method comprises broadcasting, by the data processing system, the encoded data at the determined data broadcast transmission rate over the channel to the plurality of receiver devices.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 4 is an example diagram of pseudo-code for implementing an example of the R2D2 module logic in accordance with one illustrative embodiment.

DETAILED DESCRIPTION

Figure 1:
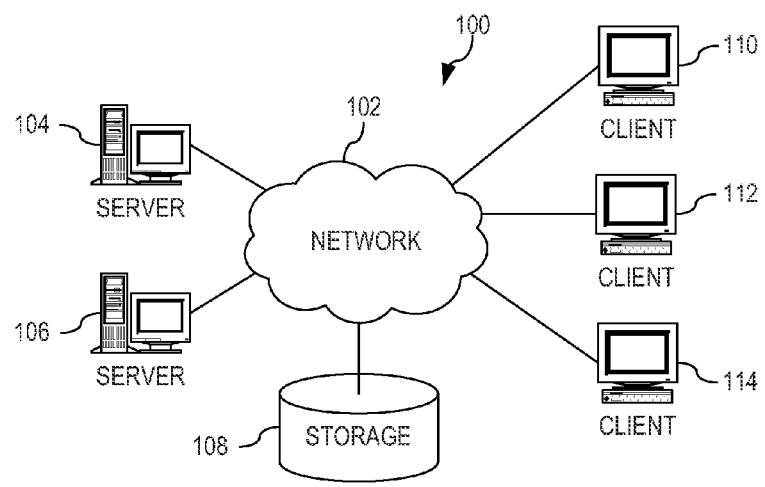
FIG. 1 is an example diagram of a distributed data processing system in which aspects of the illustrative embodiments may be implemented.

The illustrative embodiments provide mechanisms for enabling rate adaptive transmission of wireless broadcast packets. The mechanisms of the illustrative embodiments enable high speed broadcast of data packets over wireless communication connections at the media access control (MAC) layer.

As mentioned above, wireless communication devices may implement a rate adaptation module that includes logic for determining a modulation scheme to be used to transmit data packets for unicast transmissions. However, for broadcast communications rate adaptation is not implemented. To the contrary, current wireless communication chipsets send data packets only at the lowest rate, which is the most robust mode of transmission, when performing broadcast transmissions. This is referred to as the base rate in the IEEE 802.11 standards.

The rationale for sending broadcast data packets at the base rate is that there is no MAC-layer acknowledgement (ACK) in the broadcast mode of operation. As a result, the sending device cannot estimate the channel conditions of all of the various channels over which data packets are broadcast. By transmitting the data packets at the base rate the hope is to increase the likelihood that the receiver devices will correctly receive the data packets.

However, transmitting at the base rate wastes the scarce wireless capacity considering that the rates can be much higher, e.g., up to 11 Mbps for 802.11b, 54 Mbps for 802.11a/g, 600 Mbps for 802.11n, etc. Moreover, transmitting broadcast data packets at the base rates cannot accommodate bandwidth demanding applications such as high definition (HD) video streaming (e.g., live television, enterprise events, group video conferences, university lectures, et.), which can benefit from the broadcast capability.

The illustrative embodiments provide a rate adaptation framework that includes both a rate selection and error correction selection mechanism to enable high rate transmission while protecting data from high loss ratios. The rate selection and error correction mechanisms are controlled by rate adaptation framework logic described hereafter. The rate adaptation framework is compatible with existing wireless communication standards, such as IEEE 802.11 standards in that the rate adaptation framework logic does not introduce any new management packets or frames, and therefore the rate adaptation framework may be deployed in existing wireless communication environments. The rate adaptation framework may be implemented in existing wireless communication environments by upgrading the wireless driver software at the sender devices, access points, or the like, and installing application-level modules at the sender and receiver devices, as described in greater detail hereafter. The rate adaptation framework, as well as the driver software and application-level modules, are transparent to applications executing on the sender and receiver devices. Thus, for example, legacy video client applications on the sender/receiver devices may make use of the high speed broadcast functionality of the illustrative embodiments without requiring modifications to the legacy video client applications.

The rate adaptation framework mechanisms of the illustrative embodiments jointly select the data rate and error protection level of FEC to best meet an objective function. It has been determined that the average MAC layer loss ratio in typical wireless networks can be very high depending on the location and neighboring wireless/physical activity. This can be challenging to handle when it comes to broadcast rate adaptation. In the presence of high packet losses, the sender device has two options: (a) transmit at a low transmission rate for robust data delivery when the channel conditions are not acceptable (good), or (b) transmit at a high transmission rate but protect packets with a FEC scheme. It is clear that a rate adaptation algorithm that works agnostic to error protection schemes can lead to inefficient medium utilization at low loss rates or insufficient protection at high loss rates. However, the choice of transmission parameters (namely data rate and error protection) that result in the best throughput at the receiver device is not evident. In particular, the relation among rate choice, FEC protection level, loss rate at the receiver device, and the system throughput is non-trivial. This is the main challenge that the illustrative embodiments address by providing joint rate adaptation and error protection schemes.

For example, taking video streaming applications as an example, assume that the objective is to provide good performance to the worst receiver in the broadcast group. Intuitively, selecting a higher rate will likely incur higher packet losses, but will utilize the wireless communication channel more efficiently. Similarly, sending data packets with more error correction bits will provide an increased likelihood the data packets will be decoded correctly at the receiver, however, over protection can waste the wireless communication channel capacity. Since rate selection and error protection level selection both affect the efficiency of the wireless communication channel utilization, the illustrative embodiments control these parameters jointly.

In general, the mechanisms of the illustrative embodiments enable rate adaptation using application layer feedback information and provide proactive data protection mechanisms based on determined channel conditions. With the illustrative embodiments, the sender device broadcasts data packets at certain transmission rates (that is higher than the base rate in general), and each receiver sends an application-level acknowledgement back to the application-level module of the sender device. Based on the aggregate acknowledgements from the receiver devices, the sender device determines whether it should (1) increase the transmission rate; (2) decrease the transmission rate; or (3) maintain the current transmission rate. The application-layer module of the sender device is also responsible for (1) keeping track of a list of active receiver devices in the multicast group; (2) keeping track of a set of valid transmission rates among all the receiver devices; and (3) handling receiver device requests for re-transmission if needed.

Thus, with the mechanism of the illustrative embodiments, the rate adaptation decisions can be performed at an application layer rather than at a MAC layer. This enables the sender device to receive application-layer feedback from the receiver devices to perform adaptation of the broadcast transmission rate. The sender device's rate adaptation module determines which rate to be used and broadcasts data packets at higher broadcast transmission rates than the base rate by changing the network adapter driver parameters when appropriate. The receiver side modules send an application acknowledgement back to the rate adaptation module of the sender periodically. Based on loss statistics collected by the sender device's rate adaptation module for each of the broadcast communication channels, the sender device adaptive rate module calculates how much redundancy is needed to deliver a certain level of packet loss and data throughput, e.g., less than 1% frame loss rate.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing.

In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2:
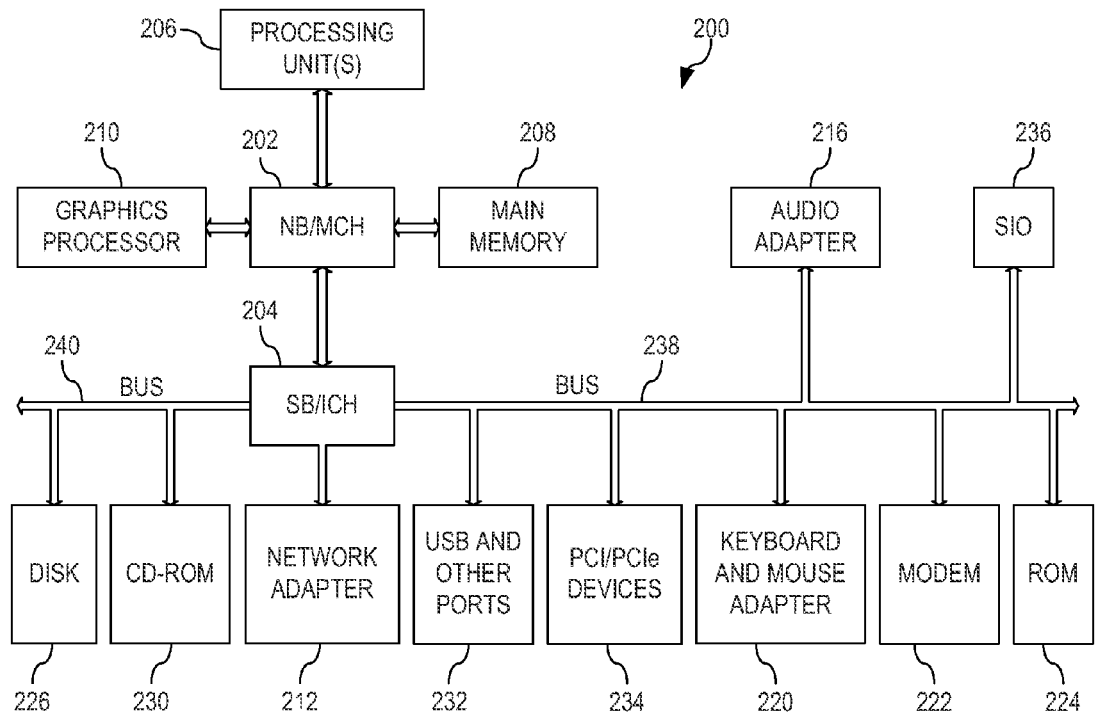
FIG. 2 is an example block diagram of a computing device in which aspects of the illustrative embodiments may be implemented.

Thus, the illustrative embodiments may be utilized in many different types of data processing environments. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram of an example data processing system in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 200.

As a server, data processing system 200 may be, for example, an IBM® eServer™ System p® computer system, running the Advanced Interactive Executive (AIX®) operating system or the LINUX® operating system. Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1 and 2 may vary depending on the implementation. Other internal hardware or peripheral devices, such as flash memory, equivalent non-volatile memory, or optical disk drives and the like, may be used in addition to or in place of the hardware depicted in FIGS. 1 and 2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device that is configured with flash memory to provide non-volatile memory for storing operating system files and/or user-generated data, for example. Essentially, data processing system 200 may be any known or later developed data processing system without architectural limitation.

Referring again to FIG. 1, one or more of the computing devices 114 illustrated in FIG. 1, e.g., servers 104, 160 and/or client computing devices 110, 112, or may communicate data with one or more other computing devices in FIG. 1 over the one or more data networks. In accordance with the illustrative embodiments, the one or more data networks 102 may comprise one or more wireless communication data network and optionally one or more wired communication data networks. Moreover, one or more of the computing devices illustrated in FIG. 1 may, as part of its operation, need to broadcast data to a plurality of different computing devices over a plurality of different communication connections via the one or more wireless data networks. For example, a server 104 may need to broadcast video content to a plurality of client devices 110, 112, and 14 over one or more wireless connections. Typically, with known broadcast mechanisms, this broadcast would have to be done at the base rate of the wireless communication standard as discussed above. However, with the illustrative embodiments, this broadcast transmission rate may be elevated to above the base rate due to the adaptive rate transmission mechanisms for wireless broadcasting.

Figure 3A:
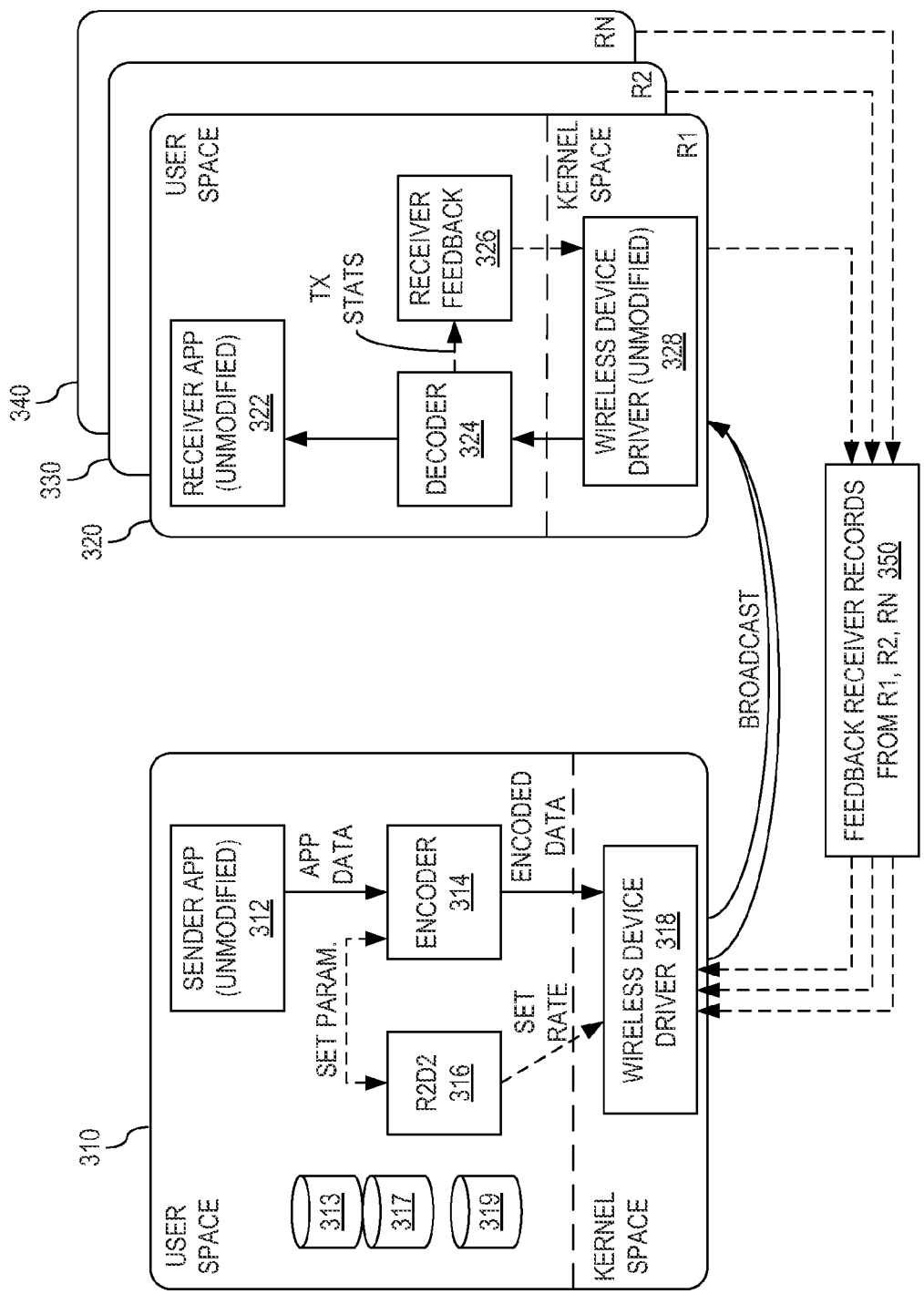
FIG. 3A which depicts an example high-level architecture of an eXtensible Wireless broadcastING (X-WING) engine in accordance with one illustrative embodiment.

The operation of the illustrative embodiments will be described in relation to FIG. 3A which depicts an example high-level architecture of an eXtensible Wireless broadcast-ING (X-WING) engine in accordance with one illustrative embodiment. The elements shown in FIG. 3A may be implemented in hardware, software, or any combination of hardware and software. In one illustrative embodiment, the elements of FIG. 3A are implemented as software instructions executing on one or more processors of one or more data processing systems. In fact, in the depicted example, the elements 310-318 may be implemented as software instructions executed on one or more processors of a sender wireless communication enabled computing device, elements 320-328 may be implemented as software instructions executed on one or more processors of a receiver wireless communication enabled computing device, and elements 330 and 340 may comprise similar software elements as that of elements 320-328 but may be implemented in additional and separate receiver wireless communication enabled computing devices. By "wireless communication enabled" what is meant is that the computing device has hardware devices available to perform wireless communication, via direct wireless communication between computing devices or via one or more wireless communication networks, with other computing devices capable of performing wireless communication in accordance with an established wireless communication standard, such as IEEE 802.11, IEEE 802.16, 3GPP, 3GPP2, LTE, for example.

The X-WING engine is a joint rate adaptation and error protection mechanism implemented to perform the functions of the illustrative embodiments as described herein. In the depicted example implementation in FIG. 3A, there is a sender side, depicted as elements 310-318, and a receiver side, depicted as elements 320-328. Elements 330 and 340 are copies of the receiver side elements but implemented on other receiver side devices. Thus, using the mechanisms of the illustrative embodiments, the sender side device, represented by sender 310, broadcasts the same content or data, e.g., video, audio, multi-media, image, executable, or any other type of content/data, to a plurality of receiver devices, represented by receivers 320, 330, and 340, over a broadcast communication channel and receives receiver feedback 350 from the receivers 320, 330, and 340, as will be described in greater detail below.

With regard to the sender side elements 310-318, the user space, or application level, of the sender 310 comprises a sender application 312 (which is unmodified from known sender applications), an encoder 314, such as a forward error correction (FEC) encoder, that implements logic of the illustrative embodiments as described hereafter, and a joint Rate and error protection overheaD (R2D2) module 316 which also implements logic of the illustrative embodiments. The kernel space, or operating system level, of the sender 310 comprises a wireless device driver 318 that has been modified to implement the logic of the illustrative embodiments as discussed hereafter.

With regard to the sender application 312, this element of the sender 310 operates in a normal fashion and is basically unchanged by the implementation of the mechanisms of the illustrative embodiments. The sender application 312 sends content/data to the encoder 314 for encoding for wireless transmission via the wireless device driver 318. The sender application 312 is oblivious of the underlying rate adaptation and error correction logic implemented by the other elements 314-318, i.e. the rate adaptation and error correction logic are transparent to the sender application. This allows the mechanisms of the illustrative embodiments to be implemented with legacy or existing sender applications 312 without requiring any modification to these sender applications 312.

Figure 3B:
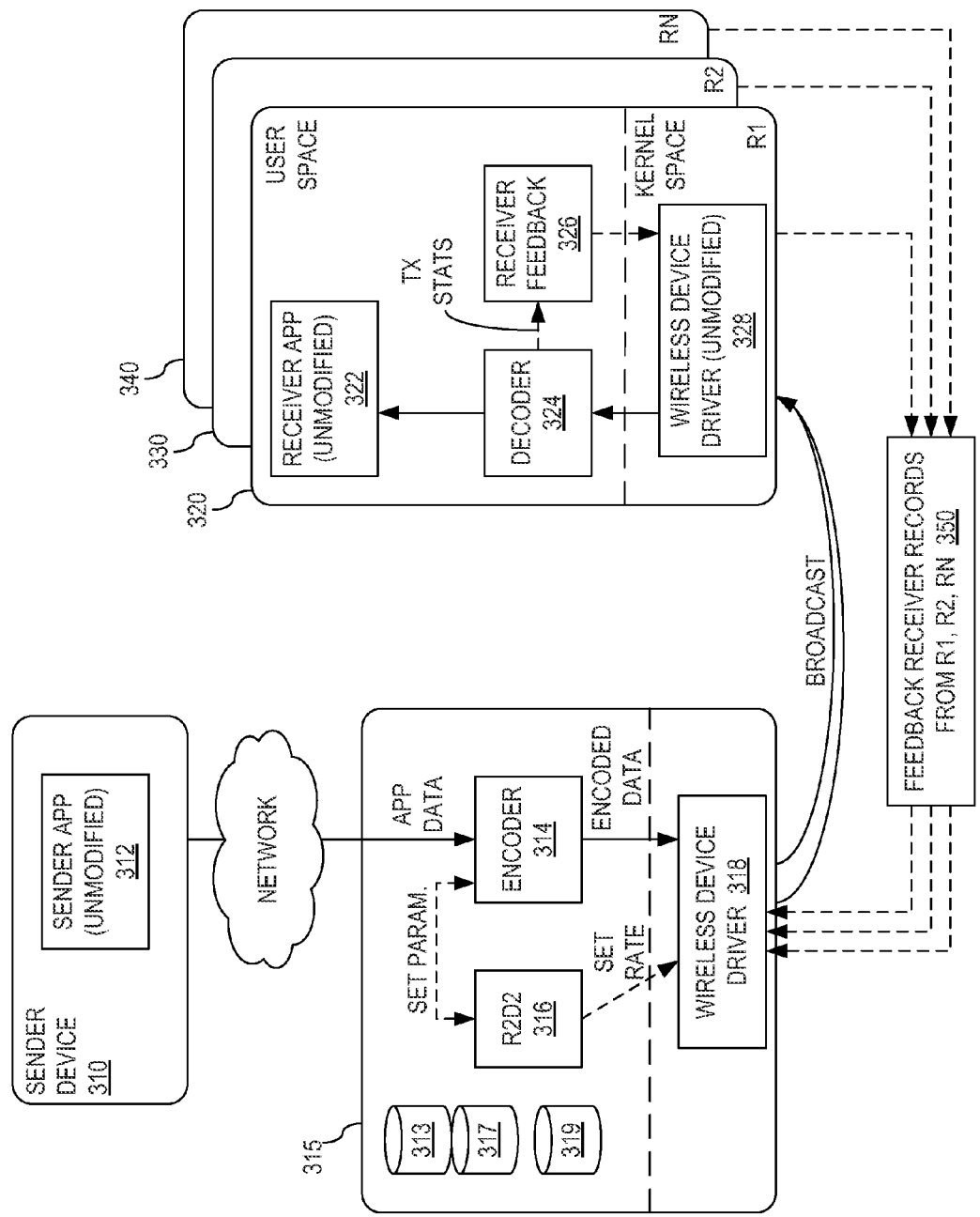
FIG. 3B is an example diagram illustrating an alternative illustrative embodiment in which the sender application is on a server coupled to a sender which is a wireless access point (WAP)

It should be noted that FIG. 3A assumes that the sender application 312 is executing in the user space, or at the application level, of the sender device. However, in some embodiments, the sender device may in fact be a wireless access point, or may otherwise receive the content/data from a sender application 312 executing on a separate device from the sender 310. For example, the sender application 312 may in fact execute on a server computing device coupled to the sender 310 which may be a wireless access point, such as via a backend wired or wireless connection. FIG. 3B is an example diagram illustrating this alternative embodiment in which the sender application 312 is on a sender device 310 coupled to a separate computing device 315 which may be a wireless access point (WAP) or the like.

Figure 3C:
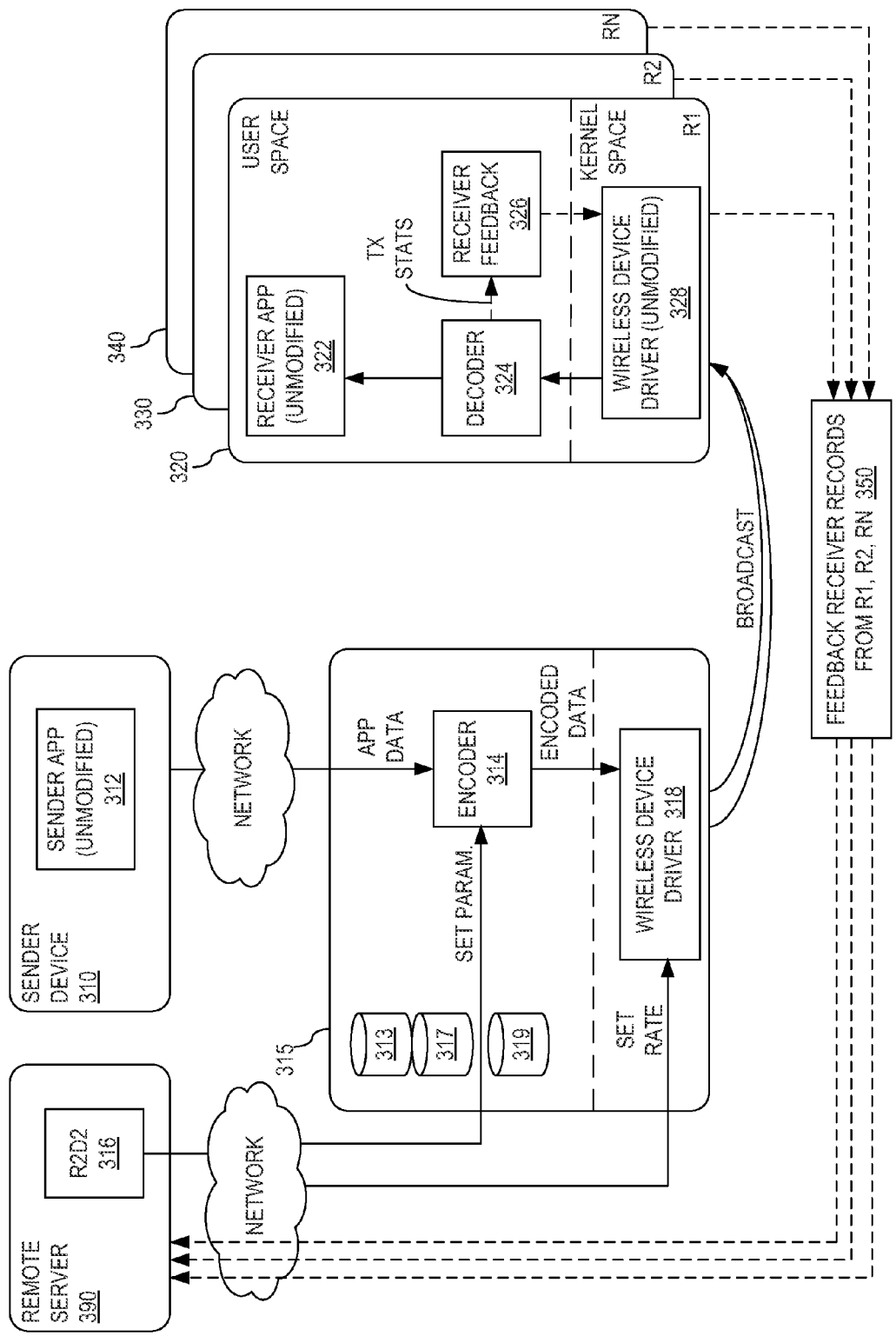
FIG. 3C is an example diagram illustrating an alternative illustrative embodiment in which the R2D2 module logic is executed at a separate computing device, such as at a WiFi controller or Edge of Network computing server near a wireless access point, for example.

It is also possible that, in some illustrative embodiments, the R2D2 module and encoder are located remotely from the wireless access point. In such an illustrative embodiment, interaction between the R2D2 module 316, the encoder module 314, and the wireless device driver 318 is facilitated via remote calls. FIG. 3C is an example diagram illustrating such an alternative embodiment. As shown in FIG. 3C, the R2D2 module 316 is provided in a remote server 390 and the encoder 314 and wireless device driver 318 are hosted in a separate computing device 315, such as a wireless access point (WAP) 315. The separate computing device 315 may also be connected via a network connection or by direct connection to a sender device 310 hosting the sender application 312 that submits data for broadcasting. Control messages for setting the transmission rate parameter and other parameters for controlling the data traffic through the separate computing device 315 may be sent from the remote server 390 to the separate computing device 315, e.g., wireless access point, which then broadcasts the data received from the sender device 310 according to the parameters set by the remote server 390.

Figure 3D:
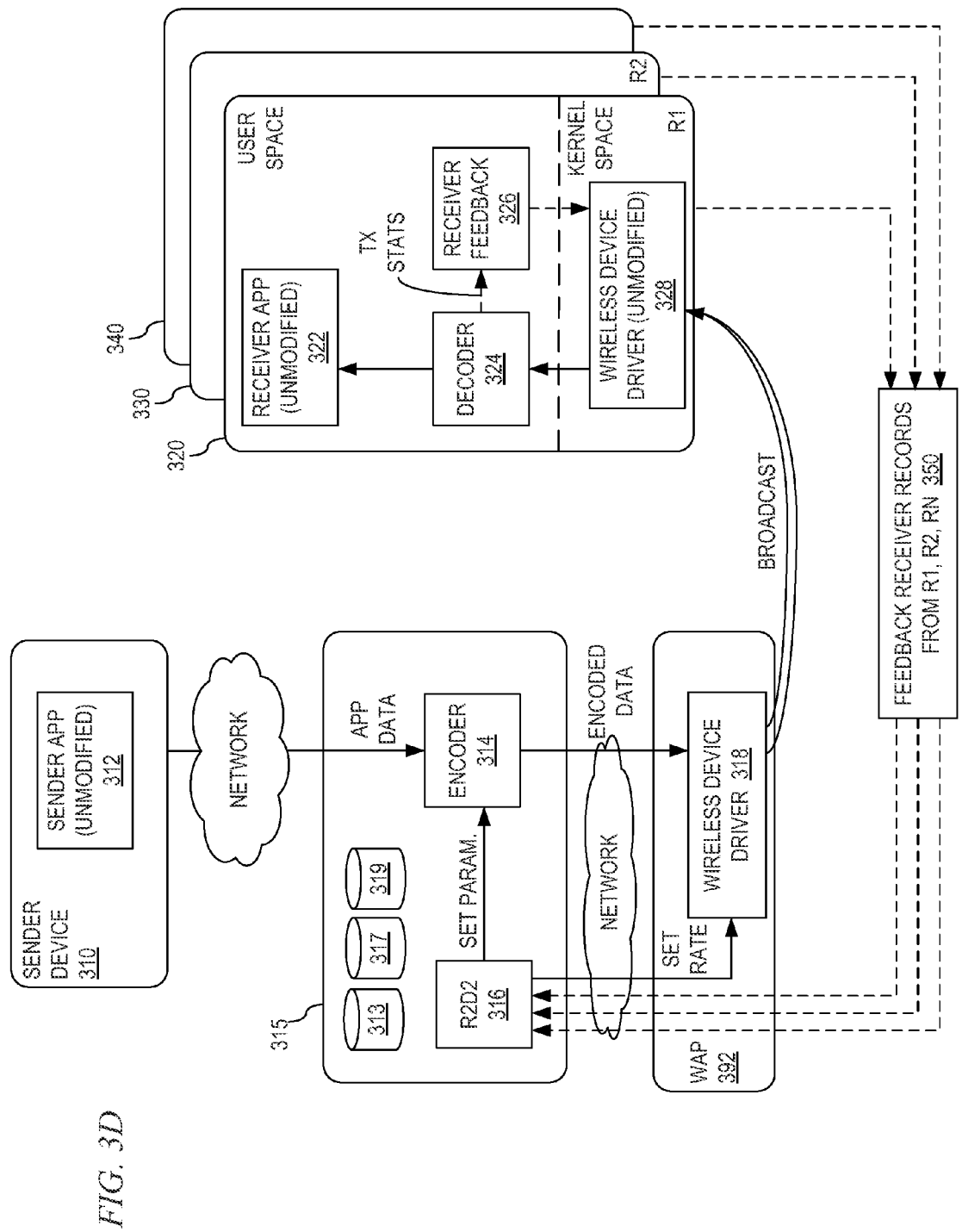
FIG. 3D is an example diagram illustrating another alternative illustrative embodiment in which the R2D2 module logic and encoder are provided in an appliance box and the wireless device driver is provided in a separate access point.

FIG. 3D is an example diagram illustrating another alternative illustrative embodiment in which the R2D2 module logic and encoder are provided in an appliance box and the wireless device driver is provided in a separate access point. The elements shown in FIG. 3D are similar to that of FIGS. 3A-3C described above. The primary difference between the illustrative embodiment of FIG. 3D and the other illustrative embodiments being the separation of the wireless device driver 318 into a separate wireless access point (WAP) 392 while the R2D2 module 316 and encoder 314 are provided in another separate computing device 315, which may be an appliance box or the like. Of course it should be appreciated that FIGS. 3A-3D are only examples of illustrative embodiments of the present invention and other configurations and organizations of the primary operational elements in the same or different computing devices and wireless communication devices may be used without departing from the spirit and scope of the illustrative embodiments.

Regardless of which illustrative embodiment implemented, the encoder 314 is a user space, or application level, module that takes the data stream from the sender application 312 and encodes the data using forward error correction codes (FECs). Since the wireless broadcasting of the data stream involves the potential for packet losses, in one illustrative embodiment, the FEC may employ erasure codes, such as Luby Transform (LT) codes, Reed-Solomon codes, or the like, that can be used to recover the original data as long as enough coded packets have been received at the receiver. For each data packet generated by encoder module 314, a sequence number is added in the application header of the data packet. If the encoder module 314 operates on blocks of original data packets, the application header of the data packet also contains the starting sequence number of the block that the packet belongs to. This allows each receiver 320, 330, 340 to detect when the sender 310 has moved onto the next data block even when some packets are lost during the broadcast transmission.

The joint Rate and error protection overheaD (R2D2) module 316 is a decision module that dynamically selects the transmission rate as well as the parameters for the encoder module 314 to thereby select the appropriate protection level based on the channel condition estimate. The R2D2 module 316 estimates the broadcast channel condition based on the feedback that the R2D2 module 316 receives from the receivers, this feedback also being referred to herein as receiver reports 350. The receiver reports (feedback) 350 contain information about packet loss rates observed by the receiver application 322 at the receiver 320, 330, 340, e.g., layer 2 loss rate, layer 7 loss rates, etc. These receiver reports 350 facilitate the R2D2 module 316 selection of appropriate rate and error correction parameters based on channel conditions for use in adapting the operational parameters or settings of the wireless device driver 318.

It should be appreciated that within the context of the present description, a broadcast channel is a collection of individual connections between a sender and one or more receivers. For example, in a wireless network, when a sender sends broadcast data packets, the sender sends the broadcast data packets into one wireless broadcast channel and all of the receivers can receive the broadcast data packets simultaneously. However, each receiver experiences individual channel characteristics. As described hereafter, the R2D2 module 316 obtains information via receiver reports 350 from all individual connections and identifies the current worst performing receiver, which may change continuously due to wireless fading and other factors affecting the connections of the broadcast channel. The R2D2 module 316 may make decisions on the broadcast rate and error protection overhead based on such receiver reports 350.

As touched on above, each receiver 320, 330, 340 sends a receiver report 350 to the sender 310 when the receiver 320, 330, 340 detects that the transmission of a current block, or a predetermined number of data packets, has occurred (by detecting changes in the start sequence number of the block, for example). The R2D2 module 316 processes the receiver reports 350 in an asynchronous manner, such as in response to the receiver reports 350 being received, the R2D2 module 316 may immediately process these receiver reports 350. Alternatively, such receiver reports 350 may be compiled and stored in association with the R2D2 module 316 for processing at predetermined time periods, such as in times where the sender 310 is not being utilized or being underutilized, or at scheduled times, for example. Details regarding the content of these receiver reports 350 and the processing performed by the R2D2 module 316 are provided hereafter.

The modified wireless device driver 318 is a modified form of known wireless device drivers in that the modified wireless device driver 318 comprises logic for permitting broadcast transmissions of content/data at rates other than the base rate of the particular wireless communication standard, e.g., IEEE 802.11. That is, rather than being limited to only using the base rate of the wireless communication standard as is typically done to increase the probability of reception in the absence of receiver feedback, the illustrative embodiments allow broadcast transmissions to be have their rate of transmission adapted to a broadcast transmission rate higher than the base rate based on channel conditions as identified from the receiver reports (feedback) 350 received from the receivers 320, 330, 340.

Before providing a detailed discussion of the operation of the encoder module 314, content of the receive reports 350, and the R2D2 module 316 operation, the receiver 320 elements will first be discussed. As shown in FIG. 3A, the receiver 320 comprises, at a user space or application level, a receiver application 322, a decoder module 324, and a receiver feedback module 326, and, at the kernel space or operating system level, a wireless device driver 328. As with the sender application 312, the receiver application 322 is unmodified by the mechanisms of the illustrative embodiments and thus, the illustrative embodiments may be implemented with legacy or existing receiver applications 322.

In addition, the wireless device driver 328, from the receiver 320 perspective, does not require any modification in order to work with the mechanisms of the illustrative embodiments. Thus, the illustrative embodiments may operate with receivers 320, 330, 340 having wireless device drivers 328 that are not modified to facilitate higher than base rate broadcast transmissions above the base rate. However, these wireless device drivers 328 may be modified according to the illustrative embodiments such that the wireless device drivers 328 may in fact be configured in a same manner as wireless device driver 318 for facilitating transmissions of greater than base rate for broadcast transmissions (although this functionality will not be used on the receiver side operation).

The decoder module 324 of the receiver 320 may be, for example, an FEC decoder or the like. The decoder module 324 transforms encoded data packets back into the original data packets and redirects them to the proper receiver application 322. This redirection can be done through typical sockets or IPC, depending on the particular receiver application 322 capabilities.

The receiver feedback module 326 collects channel condition data, such as condition statistics, for example, packet loss statistics data, e.g., layer 2 packet loss rate and layer 7 packet loss rate data. For example, packets transmitted by the sender may contain a starting sequence number of a current data block. The receiver feedback module 326 may be triggered in response to a detected change of starting sequence number in received data packets, which suggests a new data block being transmitted. The feedback module 326 may count how many data packets in the previous data block were received (encoded packets) and how many data packets were successfully decoded to the application (original packets). From this information, the feedback module 326 may generate the statistics on L2 loss rate and L7 loss rate, respectively.

The receiver feedback module 326 transmits the collected channel condition data back to the sender 310 as receiver reports 350. That is, each receiver 320, 330, 340 may generate a new receiver report for each block of data packets, or predetermined number of data packets, received by the receiver 320, 330, 340. The determination of blocks of data packets may be determined, for example, by checking the starting sequence number of each received packet. With regard to an embodiment in which a predetermined number of received packets is used, a counter and threshold value may be utilized in which the counter counts the number of received packets and this count may be compared to the threshold value to determine if the predetermined number of received packets has been received. If so, the receiver report may then be generated and transmitted to the sender 310 and the counter reinitialized.

It should be appreciated that in the X-WING framework shown in FIG. 3A, while sender 310 and receiver 320 sides of the framework are shown as being separately present in separate sender devices and receiver devices, the illustrative embodiments are not limited to such. Rather, wireless enabled computing devices may be configured to include both the sender side and receiver side elements in FIG. 3A such that the wireless enabled computing devices may operate both as sender and receivers with regard to broadcast transmissions. Thus, the illustrative embodiments may be implemented in which at least one computing device implements the sender-side elements, at least one computing device implements the receiver-side elements, and/or one or more of the computing devices may optionally actually operate as both sender and receiver by implementing both sender and receiver side elements.

Having given a general overview of the X-WING framework shown in FIG. 3A, the present description now turns to a more detailed explanation of the encoder module 314 operation, receiver reports 350, and R2D2 module 316 operation. With regard to the encoder module operation, in one illustrative embodiment, the encoder module 314 may implement a FEC encoding that employs a variant of the LT codes to provide error protection for data packets. LT codes are a type of fountain code widely used in many applications such as storage systems, video streaming, and standards like 3GPP. While the illustrative embodiments will be described in terms of the use of FEC encoding and LT codes, the illustrative embodiments are not limited to such and other types of encoding and other types of codes can be used without departing from the spirit and scope of the illustrative embodiments.

Assuming the use of LT codes in an FEC encoder module, the LT codes divide the original data into blocks, e.g., W packets per block, and use XOR operations within each block to generate new data packets to transmit following a predefined degree distribution table. The sender 310 continues generating XORed packets for a group of data packets (or block) to be sent until all receivers send an acknowledgement that the data packets for the entire block were decoded successfully. Therefore, LT codes are rateless since by using LT codes the coded data packets can have arbitrary length. However, since it is not assumed that acknowledgements from receivers 320, 330, and 340 about successful data reception for each data packet are received at the sender 310, some modifications to the LT codes are made to enable broadcast transmissions in accordance with the illustrative embodiments.

With regard to the illustrative embodiments, the encoder module 314 is modified to utilize a bounded LT codes (BLC) error protection mechanism. With this BLC error protection mechanism, for each block of data packets (containing W original data packets), the BLC error protection mechanism follows a similar procedure as known LT codes to generate a total number of W+D XORed data packets (D being a tunable parameter that is selected by the R2D2 module 316 in accordance with the dynamic channel conditions), and then move to the next block of data packets without waiting for any acknowledgement from the receiver. If the channel conditions are relatively good then the value of D may be set to a relatively small value to protect the data packets while minimizing the overhead associated with processing the data packets. On the other hand, if the channel has significant loss ratios/statistics, i.e. the channel conditions are relatively "bad," the value for D should be increased so that it can provide sufficient protection against packet losses. The measure of "good" and "bad" may be performed against an established threshold or standard that is implementation dependent, e.g., if an application can tolerate 10% data packet loss, and the channel's packet loss ratio is less than 10%, then the channel may be considered "good," and may be considered "bad" if the channel's packet loss ratio is greater than 10%. The R2D2 module 316 adjusts the error protection overhead by adjusting the value of D, while also adjusting the data rate jointly in tune with the time varying channel conditions as determined from the receiver reports 350 provided as feedback from the receivers 320, 330, and 340.

At the receivers 320, 330, 340, for each received data packet received via the wireless device driver 328, the decoder module 324 of the receiver 320, 330, 340 inspects the starting sequence number to verify whether a new block of data packets has arrived. Alternatively, as discussed above an embodiment in which a counter and threshold number of data packets may also be utilized where this counter and threshold, along with logic for performing the comparison, may be implemented in the decoder module 324. When the starting sequence number has increased, or when the counter is reinitialized or wrapped, the decoder module 324 of the receiver 320, 330, 340, decodes all of the packets received in the previous block using LT codes decoding operations and determines the channel conditions, such as by calculating the data packet loss statistics of the previous block of data packets or the like.

For example, assume each data block contains 100 data packets and the starting sequence number of the first data packet in this data block is 3001. If the receiver receives a data packet with starting sequence number as 3101, it knows that the sender has moved to the next data block. Then, the receiver will count how many data packets (encoded) were received within the window of 3001-3100, since each data packet contains its own sequence number as well. The receiver also counts how many data packets were successfully decoded for the application and generates the statistics report for the previous data block.

The receiver feedback module 326, in response to determining the channel conditions, transmits a receiver report 350 back to the sender 310 which comprises the receiver's address, e.g., IP address or the like, starting sequence number of the block if block transmission is being utilized, and the channel condition information for the block or predetermined number of data packets received by the receiver, e.g. data packet loss ratios such as the layer 2 (MAC-layer) loss ratio of the block, layer 7 (application-layer) loss ratio of the block.

In one illustrative embodiment, in order to alleviate the impact of lost reports due to errors in the channel, each report may be transmitted multiple times, e.g., 3 times, such as over a UDP connection. The frequency of sending reports affects the tradeoff between effectiveness and efficiency of the X-WING framework. More frequent reports will increase the information accuracy and enhance the responsiveness of the X-WING framework, yet will incur more overhead to both sender and receiver. In one illustrative embodiment, the report frequency is determined by the block size W.

With regard to the particular logic implemented by the R2D2 module 316 it is first beneficial to describe the objective that is achieved by the implementation of the R2D2 module 316. The objective to be achieved by the R2D2 module 316 is to provide logic that efficiently maximizes the goodput of the worst performing receiver (in terms of loss ratio or other channel condition metrics). The term "goodput" in computer networking denotes the application level throughput, i.e. the actual bits that are delivered successfully from a sender application to a receiver application per unit time.

For example, assume that the layer 2 loss ratio and layer 7 loss ratio of receiver i at time t are $p_{i,2}(t)$ and $p_{i,7}(t)$, respectively. The current maximum value of layer 7 loss ratio among all the receivers at time t is $mp_7(t)=\max(p_{i,7}(t))$. In this case, the objective may be to provide an efficient algorithm to maximize the application layer goodput of the worst performing receiver with regard to layer 7 loss ratio at time t, defined as:

$$\max R(t)*(W(t)/(W(t)+D(t)))*(1-mp_7(t))$$

$$s.t.\ mp_7(t) \leq \alpha \qquad (1)$$

where α is an application-specific requirement for the loss ratio, e.g., layer 7 loss ratio at time t, and R(t), W(t), and D(t)

are the normal data rage of the IEEE 802.11 MAC layer, the block size of the FEC, and the overhead of FEC, respectively. For purposes of explanation only, it will be assumed in this description that the block size W is fixed and that the goal of the R2D2 module logic is to adjust R(t) and D(t) dynamically to maximize equation (1) above based on the channel information obtained from the receiver reports 350. It should be appreciated, however, that the mechanisms of the illustrative embodiments are not limited to using a fixed block size W and in fact can dynamically optimize the block size W as well as the other elements of the equation (1).

It should be noted that $mp_7(t)$ is a function of R(t) and D(t) for a given channel loss condition. In order to decrease $mp_7(t)$, a lower R(t) can be selected, which is analogous to rate adaptation solutions used for unicast transmissions. However, in embodiments where a FEC encoder is utilized, R(t) can also be retained unchanged and the coding overhead of the bounded LT codes (D(t) can be increased/decreased by an appropriate amount to increase the value of equation (1). Thus, existing rate adaptation schemes for unicast communications cannot be applied directly and it is imperative to provide a new rate adaptation which considers the coupling between R(t), D(t), and $mp_7(t)$ jointly in making rate adaptation decisions. The R2D2 module 316 logic provides such a new rate adaptation mechanism which dynamically tunes the rate selected for broadcast transmissions in tandem with the coding overhead jointly in accordance with the time-varying channel conditions as identified from feedback receiver reports 350 received from the receiver devices.

It should be noted that the objective function illustrated in equation (1) above represents the application goodput of the worst performing receiver under heavy traffic (backlog) scenarios, or the airtime efficiency, defined as the number of application received frames (or data packets) received per unit transmission time (sender side). The illustrative embodiments, however, are not limited to using only this objective function and other objective functions can be used without departing from the spirit and scope of the illustrative embodiments. Examples of alternative objective functions will be described in greater detail hereafter.

For notation brevity herein, the objective function illustrated in equation (1) can be generally represented as:

$$O(t)=(W(t)/(W(t)+D(t)))*(1-mp_7(t)) \quad (2)$$

It should be noted that for any fixed rate R(t), the value of equation (2) above is determined by D(t) and the layer 2 loss ratio p2 (for any fixed W). From equations (1) and (2) above, it can be seen that the value of $mp_7(t)$ is determined by R, D, and $p_2$. In other words, for a given error correction algorithm and a fixed channel condition, rate R will determine the $p_2$ value, which will determine (together with the D value) the value of $p_7$, and thus $mp_7(t)$ in equation (2). In general, $p_7$ is the application level loss, i.e., loss ratio after decoding, and $p_2$ is the link layer loss, i.e., loss ratio before decoding.

From the above, it can be seen that the optimum value of equation (2) may be pre-calculated for each value of $p_2$, denoted by $O*(p_2)$, as well as the optimum value of $D*(t)$ that generates $O*(p_2)$. Calculating $O*(p_2)$ can be done in various ways. For example, the data transmission between the sender and the receiver may be simulated with different $p_2$ values and the corresponding $p_7$ and O(t) values may be recorded. The O(t) value that is determined to be the best O(t) value, e.g., maximum O(t) value, may be selected as $O*(p_2)$ and the corresponding $p_7$ as $p_7*$. These values may be recorded in a parameter table data structure 317 and may be utilized to set the appropriate corresponding operational parameters of the encoder module 314 and wireless device driver 318.

As a concrete example, Table 1 provides a parameter table data structure generated for the bounded LT codes. Such a parameter table data structure 317 needs to be generated only once for a given error protection scheme implemented in the encoder module 314. Thereafter, it may be used by the R2D2 module 314 to make determinations as to data rate selections and error protection level settings jointly for broadcasts of content/data to the receivers. The values of D may be bounded in order to limit the maximum error protection that can be provided, which is restricted by the application data rate from the sender application.

TABLE 1

Parameter Table with $\alpha = 0.1$ and $D \le 200$.

| $p_2$ (%) | $O*(p_2)$ | $D*(p_2)$ | $p_7*$ (%) |
|---|---|---|---|
| 0 | N/A | 0 | 0.00 |
| 5 | N/A | 0 | 5.00 |
| 10 | 0.7012 | 50 | 5.88 |
| 15 | 0.6200 | 50 | 7.00 |
| 20 | 0.6020 | 50 | 9.00 |
| 25 | 0.4800 | 100 | 4.00 |
| 30 | 0.4693 | 100 | 6.14 |
| 35 | 0.4643 | 100 | 7.14 |
| 40 | 0.3776 | 150 | 5.61 |
| 45 | 0.3772 | 150 | 5.69 |
| 50 | 0.3117 | 200 | 6.49 |
| 55 | 0.3101 | 200 | 6.98 |
| 60 | 0.27946 | 200 | 16.16 |
| 65 | 0.26735 | 200 | 19.80 |
| 70 | 0.19150 | 200 | 42.55 |
| 75 | 0.13796 | 200 | 58.61 |
| 80 | 0.08435 | 200 | 74.69 |
| 85 | 0.05231 | 200 | 84.31 |
| 90 | N/A | 0 | 90.00 |

Besides the aforementioned table-based approach, another way to determine the optimum value of $D*(t)$ is to use curve-fitting methods. For example, for a fixed value of $p_2$, experiments can be run to emulate the encoding and decoding procedures of the FEC scheme to characterize the relationship between the value of D and the observed $p_7$. Thereafter, one can utilize curve fitting methods to obtain an analytical expression between D and $p_7$. In other words, the value of $p_7$ will be expressed as a function with respect to the value of D. Therefore, the optimum value of $D*(t)$ can be obtained via numerical optimization methods.

Returning to the specific operation of the R2D2 module 314, for each receiver report 350 received as feedback by the R2D2 module 314 via the wireless device driver 318, the R2D2 module 314 verifies whether this is a duplicate receiver report 350 by checking the receiver IP address and the starting sequence number of the block, or other receiver report identifier included in the receiver report 350. Duplicate receiver reports 350 are discarded without further processing. Non-duplicate receiver reports 350 are stored into a report record of a receiver report data structure 319, such as a hash table, where each receiver device has on entry in the receiver report data structure 319 for its most recent receiver report 350 sent by the receiver to the sender. The R2D2 module 316 continues to compute new values of R and D if the new receiver report 350 updates the $mp_7(t)$ value, i.e. the application data packet loss rate of the current worst performing receiver. Therefore, if the receiver report 350 is not from the current worst performing receiver, the R2D2 module 316 will not modify the R and D values. Otherwise, the R2D2 module 316 will first record the current value of R(t) and the value of $R(t)O*(mp_2(t))$ into another data structure 313 referred to as the rollback record data structure 313, which also may be a hash table, where each receiver has one entry, and then triggers an update process to compute new values for R and D based on the current value of $mp_7(t)$ and its corresponding layer 2 loss ratio, denoted $mp_2(t)$.

An example logic that may be implemented within the R2D2 module 316 will now be made with reference to the following notations:

(1) SameRate: $R(t)O^*(mp_2(t))$;

(2) IncreaseRate: $R_{MAX}O^*(mp_2(t)')$, where $mp_2(t)+$ denotes the adjacent entry in the parameter table data structure with a larger $p_2$, e.g., if $mp_2(t)=25\%$, $mp2(t)+=30\%$ in Table 1, and $R_{MAX}$ is the maximum data rate available according to the particular wireless standard;

(3) DecreaseRate: $R^-O^*(mp_2(t)^-)$, where $mp_2(t)^-$ denotes the next entry in the parameter table data structure with a smaller $p_2$, e.g., if $mp_2(t)=25\%$, $mp_2(t)^-=20\%$ in Table 1, and $R^-$ is the next available rate in the rate set which is smaller than $R(t)$, if it exists; and (4) Rollback: $R(t-1)O^*(mp_2(t-1))$ which is obtained from the rollback record data structure, i.e. the previous parameter settings for this specific receiver.

SameRate captures the best performance of the worst performing receiver in the plurality of receivers to which the content/data is broadcast in terms of equation (1) above if the current data rate is unchanged. Similarly, IncreaseRate is an optimistic estimate about the performance gain by increasing the data rate. It should be noted that, in one illustrative embodiment, the R2D2 module 316 logic uses $R_{MAX}$ instead of $R^-$, defined as the next available data rate in the data rate set which is larger than $R(t)$, to estimate the performance gain. Therefore, the R2D2 module 316 logic favors higher data rate and inclines to increase the data rate optimistically. The rationale that the R2D2 module 316 logic will only increase data rate to the next adjacent higher value is to avoid instable network behaviors and drastic network performance changes, which is essentially to maintain a stable experience and prevent the adverse impact of overestimation. In contrast, DecreaseRate denotes an estimation on the best performance that can be achieved if the data rate decreases.

By comparing SameRate, IncreaseRate, and Decrease Rate, the R2D2 module 316 logic estimates the potential performance gain by keeping the current data rate, increasing the data rate, and decreasing the data rate in order to take appropriate data rate modification operations. The role of Rollback is to replace either IncreaseRate or DecreaseRate when estimating the performance, based on the relationship between current rate $R(t)$ and the previous rate $R(t-1)$ for this receiver. If $R(t)>R(t-1)$, it can be inferred that this receiver had a recent rate increase from $R(t-1)$ to $R(t)$. Therefore, compared to DecreaseRate, the Rollback value has more accurate and recent information on the performance that can be achieved by decreasing $R(t)$. In light of this, the R2D2 module 316 logic will compare SameRate, IncreaseRate, and Rollback in order to make rate adjustments. By the same token, if $R(t)<R(t-1)$, the R2D2 module 316 logic will replace IncreaseRate by Rollback and compare SameRate, DecreaseRate, and Rollback.

It should be noted that, with the logic of the R2D2 module 316, the data rate will either remain unchanged, or increase/decrease one level at a time. The rollback option can also alleviate the effect of hidden terminals (also referred to as "hidden stations" or "hidden nodes"), i.e. uncontrollable devices with background traffic which may cause packet loss due to "collisions" rather than wireless fading. In such cases, decreasing the data rate will not improve the layer 2 loss ratio significantly due to the collision losses (see Wong et al., "Robust Rate Adaptation for 802.11 Wireless Networks," ACM Mobicom 2006). As a consequence, Rollback will have a larger value than SameRate, and the R2D2 module 316 logic is inclined to rolling back to the previous setting according to the R2D2 module 316 logic, which is a favorable decision. This is because a lower data rate cannot resolve the issue of hidden terminals and it is advisable to utilize higher data rates in such cases. The R2D2 module 316 logic will send an instruction back to the encoder module 314 to update D (where D=0 indicates no error protection) and modify the transmission rate R at the wireless device driver 318 level.

FIG. 4 is an example diagram of pseudocode for implementing an example of the R2D2 module logic in accordance with one illustrative embodiment. As shown in FIG. 4, if $R(t)>R(t-1)$, then the logic compares the SameRate, IncreaseRate, and Rollback values and determines if the SameRate is the largest. If so, then subroutine f0( ) is executed, which essentially keeps the same rate and sets $D(t+1)$ to $D^*(mp_2(t))$. If IncreaseRate is the largest value, then the subroutine f1( ) is executed, which essentially increases the rate by one level (if the next level exists), and sets $D(t+1)$ to $D^*(mp_2(t)^+)$. If Rollback is the largest, then the subroutine f3( ) is executed, which essentially rolls back $D(t+1)$ and $R(t+1)$ to the previous setting, i.e. $R(t+1)=R(t-1)$, $D(t+1)=D^*(mp_2(t-1))$.

Similar comparisons and callings of the various subroutines are performed for the criteria where $R(t)<R(t-1)$ and $R(t)=R(t-1)$ as shown in FIG. 4. As noted in FIG. 4, if there is a tie between values, then the tie is broken arbitrarily such that either value may be selected as the largest in an arbitrary manner.

To further illustrate the operation of the logic of the R2D2 module 316 in accordance with the pseudocode shown in FIG. 4, assume an example, using Table 1 above. Assume that the current data rate is 36 Mbps and one receiver sends back a receiver report 350 with the worst $p_7$ performance (data packet loss ratio) in the current records, and its associated $p_2$ is 0.25 data packet loss ratio. The R2D2 module 316 logic will first calculate the SameRate, IncreaseRate, and DecreaseRate values as follows:

SameRate: $RO^*(0.25)=36\times0.4800=17.28$

IncreaseRate: $R_{MAX}O^*(0.30)=54\times0.4693=25.34$

DecreaseRate: $R^-O^*(0.2)=24\times0.6020=14.45$

Therefore, R2D2 module 316 logic will first record 36 Mbps and 17.28 Mbps into the rollback record data structure 313 for this receiver for future reference, and increase the data rate from 36 Mbps to 48 Mbps and set $D=D^*(0.30)=100$ for transmissions. Later, the same receiver may send back a receiver report 350 indicating a new $p_2$ data packet loss ratio of 0.45 (assuming it is still the worst receiver in terms of $p_7$). The R2D2 module 316 logic will verify that the new p2 is the consequence of a rate increase ($R(t)>R(t-1)$), and hence compare the values of SameRate, IncreaseRate, and Rollback, where the values are $48\times O^*(0.45)=18.11$, $54\times O^*(0.50)=16.83$, AND 17.28. In this case, the R2D2 module 316 logic will keep the current rate and D value unchanged until the next update process is triggered by new receiver reports 350 being received.

Thus, the illustrative embodiments provide mechanisms for enabling rate adaptive transmission of wireless broadcast packets. While the above illustrative embodiments are described as employing bounded LT codes as the error correction mechanism for data packets (or frames) because of the low complexity and ease of implementation, the illustrative embodiments are not limited to use with bounded LT codes.

In general, one can adopt any error correction code that provides sufficient error protection for the channel, such as Reed-Solomon codes, Tornado codes, or Raptor codes, for example. "Sufficiency" is measured by the established application requirements, e.g. the application's acceptable data packet loss ratio. For example, some applications may tolerate a loss ratio of 5%, while other applications may tolerate only 1% loss ratio. The error protection is sufficient if the application specific requirements are met.

Moreover, with the mechanisms of the illustrative embodiments, there can be multiple multicast groups within the broadcast range. These groups may be formed to support different applications or administrative domains. The X-WING framework can be extended to include a multicast group management module (not shown) for managing the individual groups while the R2D2 module is applied to each of the individual groups. In such an embodiment, the transmission rates for broadcasts can be different for each of the individual groups in the multicast group.

In the description above, an objective function was described for maximizing the application layer goodput of the worst performing receiver, such as may be determined as the receiver with the highest loss ratio, for example. It should be appreciated that the illustrative embodiments are not limited to any particular objective function and may be implemented with different objective functions. For example, the illustrative embodiments may be used with an objective function to maximize the goodput of the worst receiver above a certain packet loss rate. Such an objective function would be useful, for example, to group receivers into multiple groups, e.g., one group for high definition video streaming and another group (with poorer channel quality) for standard definition video streaming. Other more complex objective functions may be used without departing from the spirit and scope of the illustrative embodiments.

Figure 5:
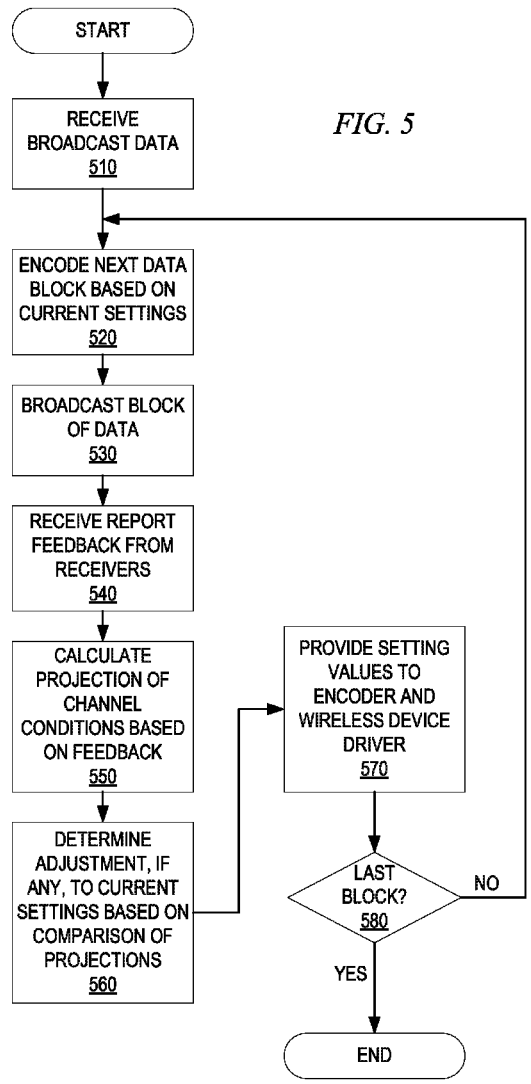
FIG. 5 is a flowchart outlining an example operation for determining a broadcast transmission rate in accordance with one illustrative embodiment.

FIG. 5 is a flowchart outlining an example operation for determining a broadcast transmission rate in accordance with one illustrative embodiment. The operation outlined in FIG. 5 may be implemented using a combination of the R2D2 module 316, the modified encoder module 314, and modified wireless device driver 318 in FIG. 3A, for example.

As shown in FIG. 5, the operation starts by receiving data from a sender application for broadcast to a plurality of receiver applications on receiver devices (step 510). The application data is provided to the encoder which encodes the next block of data packets in accordance with an level of error protection corresponding to a current encoding overhead value determined via the objective function calculations (or lookup operation), e.g., the D value described above, or a default value if no previous objective function calculation has been performed (step 520). The block of data packets generated by the encoder are broadcast by the wireless device driver at a rate set by the R2D2 module based on the previous objective function calculations (or lookup operation), if any, or a default rate if no previous objective function calculations have been performed (step 530).

The R2D2 module then receives receiver report feedback from the receivers regarding the channel conditions of the channels over which the block of data packets were transmitted (step 540). Based on the channel condition information in the receiver report feedback received from the receivers, one or more objective function calculations, or lookup operations, may be performed to determine projected values for channel conditions should the rate and error protection overhead be kept the same, increased, or decreased (step 550). Based on these calculations, or lookup operations, an appropriate transmission data rate and overhead value are set, such as by keeping these values the same, increasing them, or decreasing them, for use with transmitting a next block of data packets (step 560). This may include, for example, comparing the projected channel conditions for various operations of keeping the same settings, increasing them, or decreasing them, as previously described above. These values are communicated to the encoder and wireless device driver for configuring the encoder and wireless device driver to use a corresponding level of error protection and transmission rate, respectively (step 570).

A determination is made as to whether a last block of the application data has been broadcast (step 580). If not, the operation then returns to step 520 to encode and broadcast the next block of data and the operation repeats. If so, then the operation terminates.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for broadcasting data to a plurality of receiver devices, comprising:

receiving, from a plurality of receiver devices, feedback information comprising channel condition information specifying conditions of one or more connections of a channel over which data was previously broadcast to the receiver devices;

determining, by the data processing system, a data broadcast transmission rate and a level of error protection to be used when broadcasting data, based on the feedback information received from the plurality of receiver devices;

encoding, by the data processing system, data to be broadcast to the plurality of receiver devices in accordance with the determined level of error correction by encoding the data using bounded Luby Transform (LT) codes (BLC) error protection encoding in which a number of data packets generated for a block of data is dynamically determined based on the channel condition information; and broadcasting, by the data processing system, the encoded data at the determined data broadcast transmission rate over the channel to the plurality of receiver devices.

2. The method of claim 1, wherein the determined data broadcast transmission rate is greater than a base data transmission rate for a protocol used to perform the data broadcast.

3. The method of claim 1, wherein the prior feedback received from the plurality of receiver devices comprises application-level acknowledgement packets received from the receiver devices, and wherein the data broadcast transmission rate and the level of error protection to be used when broadcasting data are determined based on an aggregate of the application-level acknowledgement packets received from the plurality of receiver devices.

4. The method of claim 1, wherein each application-level acknowledgement packet specifies at least one data packet loss statistic for a corresponding connection of the channel.

5. The method of claim 4, wherein the at least one data packet loss statistic is at least one of a Media Access Control (MAC) layer data packet loss statistic for a block of data or an application layer data packet loss statistic for the block of data.

6. The method of claim 4, wherein the application-level acknowledgement packet is generated by a receiver device in response to a detection of a change in a data block of data received at the receiver device.

7. The method of claim 1, wherein determining the data broadcast transmission rate and the level of error protection to be used when broadcasting data, based on prior feedback received from the plurality of receiver devices, comprises at least one of increasing a previous data broadcast transmission rate, decrease the previous data broadcast transmission rate, or not modify the previous data broadcast transmission rate.

8. The method of claim 1, wherein determining the data broadcast transmission rate and the level of error protection is performed at an application layer.

9. The method of claim 1, wherein the method is transparent to a sender application providing the data to be broadcast.

10. The method of claim 1, wherein determining the data broadcast transmission rate and the level of error protection to be used when broadcasting data comprises determining the data broadcast transmission rate and level of error protection application layer so as to increase a goodput of a worst performing receiver device in the plurality of receiver devices.

11. The method of claim 1, wherein determining the data broadcast transmission rate and the level of error protection comprises maximizing a goodput of a worst performing receiver device in the plurality of receiver devices by satisfying the following relationship:

$$\max R(t)*(W(t)/(W(t)+D(t)))*(1-mp_7(t))$$

$$s.t.\ mp_7(t) \le \alpha$$

where $\alpha$ is an application-specific requirement for a loss ratio at time t, and $R(t)$, $W(t)$, and $D(t)$ are the normal data rate of the Media Access Control (MAC) layer, a block size of the encoding, and a overhead of the encoding, respectively, and $mp_7(t)$ is a current maximum value of a layer 7 loss ratio.

12. The method of claim 1, wherein determining the data broadcast transmission rate and the level of error protection to be used when broadcasting data, based on prior feedback received from the plurality of receiver devices, comprises performing a lookup operation in a predefined lookup table that correlates data broadcast transmission rates and levels of error protection for a plurality of different channel conditions.

13. The method of claim 1, further comprising:
prior to determining the data broadcast transmission rate and the level of error protection to be used when broadcasting data, storing a current broadcast transmission rate and level of error protection in a rollback data structure thereby storing rollback data transmission rate and rollback error protection level values.

14. The method of claim 13, wherein determining the data broadcast transmission rate and the level of error protection comprises determining if the data broadcast transmission rate and the level of error protection should be roiled back to the rollback data transmission rate and rollback error protection level values.

15. The method of claim 1, wherein determining the data broadcast transmission rate and the level of error protection comprises:
calculating a SameRate value representing a current best performance of a worst performing receiver device in the plurality of receiver devices should a current data broadcast transmission rate be unchanged;
calculating an IncreaseRate value representing an estimate about a performance gain by increasing the current data broadcast transmission rate to a next available higher data broadcast transmission rate;
calculating a DecreaseRate value representing an estimate of the best performance that can be achieved from the receiver devices in response to the data broadcast transmission rate being decreased to a next available lower data broadcast transmission rate; and
determining the data broadcast transmission rate and the level of error protection based on the SameRate, IncreaseRate, and DecreaseRate values.

16. The method of claim 15, wherein determining the data broadcast transmission rate and the level of error protection based on the SameRate, IncreaseRate, and DecreaseRate values comprises:
comparing the SameRate, IncreaseRate, and DecreaseRate values to determine an appropriate action to be performed to select the data broadcast transmission rate; and
performing the determined appropriate action to thereby select the data broadcast transmission rate.

17. The method of claim 16, wherein determining the data broadcast transmission rate and the level of error protection further comprises:
comparing a current data rate of a receiver device with a previous data rate of the receiver device;
determining, based on the comparison of the current data rate of the receiver device with the previous data rate of the receiver device, whether or not to replace one of the IncreaseRate or DecreaseRate values with a Rollback value; and
replacing one of the IncreaseRate or DecreaseRate with the Rollback value based on the comparison and the determination as to whether or not to replace the value.

18. The method of claim 16, wherein the first computing device is a remote server and the second computing device is one of a wireless access point or an edge server.

19. The method of claim 1, wherein the receiving and determining operations are performed by a first computing device in the data processing system, and wherein the encoding and broadcasting operations are performed by a second computing device, in the data processing system, separate from the first computing device.

* * * * *